US012756912B1

(12) United States Patent
Patel et al.

(10) Patent No.: US 12,756,912 B1
(45) Date of Patent: Oct. 6, 2026

(54) ORGANIC SUBSTRATE FOR PLACING COMPONENTS OF A CAMERA

(71) Applicant: Apple Inc., Cupertino, CA (US)

(72) Inventors: Himesh Patel, Fremont, CA (US); Paulom Shah, San Jose, CA (US); Julien C. Vittu, Saratoga, CA (US); Qiang Yang, Fremont, CA (US); Roshan Murthy, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 740 days.

(21) Appl. No.: 17/934,180

(22) Filed: Sep. 21, 2022

Related U.S. Application Data

(60) Provisional application No. 63/248,395, filed on Sep. 24, 2021.

(51) Int. Cl.

| | |
|---|---|
| ***H05K 1/03*** | (2006.01) |
| ***G02B 5/20*** | (2006.01) |
| ***G02B 27/64*** | (2006.01) |
| ***G03B 5/00*** | (2021.01) |
| ***G03B 11/00*** | (2021.01) |
| ***H04N 23/54*** | (2023.01) |
| ***H05K 1/02*** | (2006.01) |

(Continued)

(52) U.S. Cl.
CPC ............. *H04N 23/54* (2023.01); *G02B 5/208* (2013.01); *G02B 27/646* (2013.01); *G03B 5/00* (2013.01); *G03B 11/00* (2013.01); *H05K 1/0274* (2013.01); *H05K 1/0313* (2013.01); *H10F 39/804* (2025.01); *G03B 2205/0007* (2013.01); *H04N 23/50* (2023.01); *H05K 2201/10121* (2013.01); *H05K 2201/10151* (2013.01)

(58) Field of Classification Search
CPC .......... H04N 23/54; G02B 5/208; G03B 5/00; G03B 11/00; G03B 2205/0007; H05K 1/0274; H05K 1/0313; H05K 2201/10121; H05K 2201/10151; H10F 39/804
See application file for complete search history.

(56) References Cited

U.S. PATENT DOCUMENTS

| | | | | |
|---|---|---|---|---|
| 7,411,733 B2 | 8/2008 | Toyoda et al. | | |
| 8,193,555 B2 * | 6/2012 | Lin | ......................... H10F 77/50 | 257/E51.027 |
| 9,029,759 B2 | 5/2015 | Singh et al. | | |

(Continued)

FOREIGN PATENT DOCUMENTS

| | | |
|---|---|---|
| CN | 112466896 | 3/2021 |

*Primary Examiner* — David Vu
*Assistant Examiner* — Brandon C Fox
(74) *Attorney, Agent, or Firm* — Robert C. Kowert; Kowert, Hood, Munyon, Rankin & Goetzel, P.C.

(57) ABSTRACT

A camera may include an organic substrate for placement of one or more components. An image sensor may be attached to the organic substrate to capture light passing through one or more lenses of the camera. The image sensor and the organic substrate may be moved, using an actuator, relative to the lenses in one or more directions. The organic substrate may be one single piece of an organic printed circuit board (PCB), or include multiple separate organic PCBs joined together. The organic substrate may include a first recess at a first side towards the lenses, and/or a second recess at a second side opposite the first side near an edge of the organic substrate.

20 Claims, 8 Drawing Sheets

(51) Int. Cl.
*H10F 39/00* (2025.01)
*H04N 23/50* (2023.01)

(56) References Cited

U.S. PATENT DOCUMENTS

| | | | | |
|---|---|---|---|---|
| 11,172,131 | B1 * | 11/2021 | Le | G03B 3/10 |
| 12,360,385 | B1 * | 7/2025 | Yang | G02B 27/64 |
| 2014/0035079 | A1 * | 2/2014 | Jan | H10F 39/806<br>257/E31.127 |
| 2014/0035081 | A1 * | 2/2014 | Jan | H10F 39/804<br>257/E31.127 |
| 2017/0280558 | A1 * | 9/2017 | Ohara | G03B 17/02 |
| 2020/0043965 | A1 * | 2/2020 | Otani | H10F 39/811 |
| 2020/0217992 | A1 | 7/2020 | Kajiya et al. | |
| 2021/0028216 | A1 * | 1/2021 | Hubert | H04N 23/55 |

* cited by examiner

ORGANIC SUBSTRATE FOR PLACING COMPONENTS OF A CAMERA

This application claims benefit of priority to U.S. Provisional Application Ser. No. 63/248,395, entitled "Organic Substrate for Placing Components of a Camera," filed Sep. 24, 2021, and which is hereby incorporated herein by reference in its entirety.

BACKGROUND

Technical Field

This disclosure relates generally to a camera and more specifically to a camera including an organic substrate for placement of components of the camera.

Description of the Related Art

Mobile multipurpose devices such as smartphones, tablets, and/or pad devices are considered as a necessity nowadays. They integrate various functionalities in one small package thus providing tremendous convenience for use. Most, if not all, of today's mobile multipurpose devices include at least one camera. Some cameras may incorporate optical image stabilization (OIS) mechanisms that may sense and react to external excitation/disturbance by adjusting location of an image sensor relative to a lens of the camera in an attempt to compensate for unwanted motion of the lens. Furthermore, some cameras may incorporate an autofocus (AF) mechanism whereby the object focal distance can be adjusted to focus an object plane in front of the camera at an image plane to be captured by the image sensor. The advent of mobile multipurpose devices results in requirement for continuous improvement of the quality of their integrated cameras. Thus, it is desirable to have techniques to improve the performance and reliability of cameras in mobile multipurpose devices.

Figure 1:
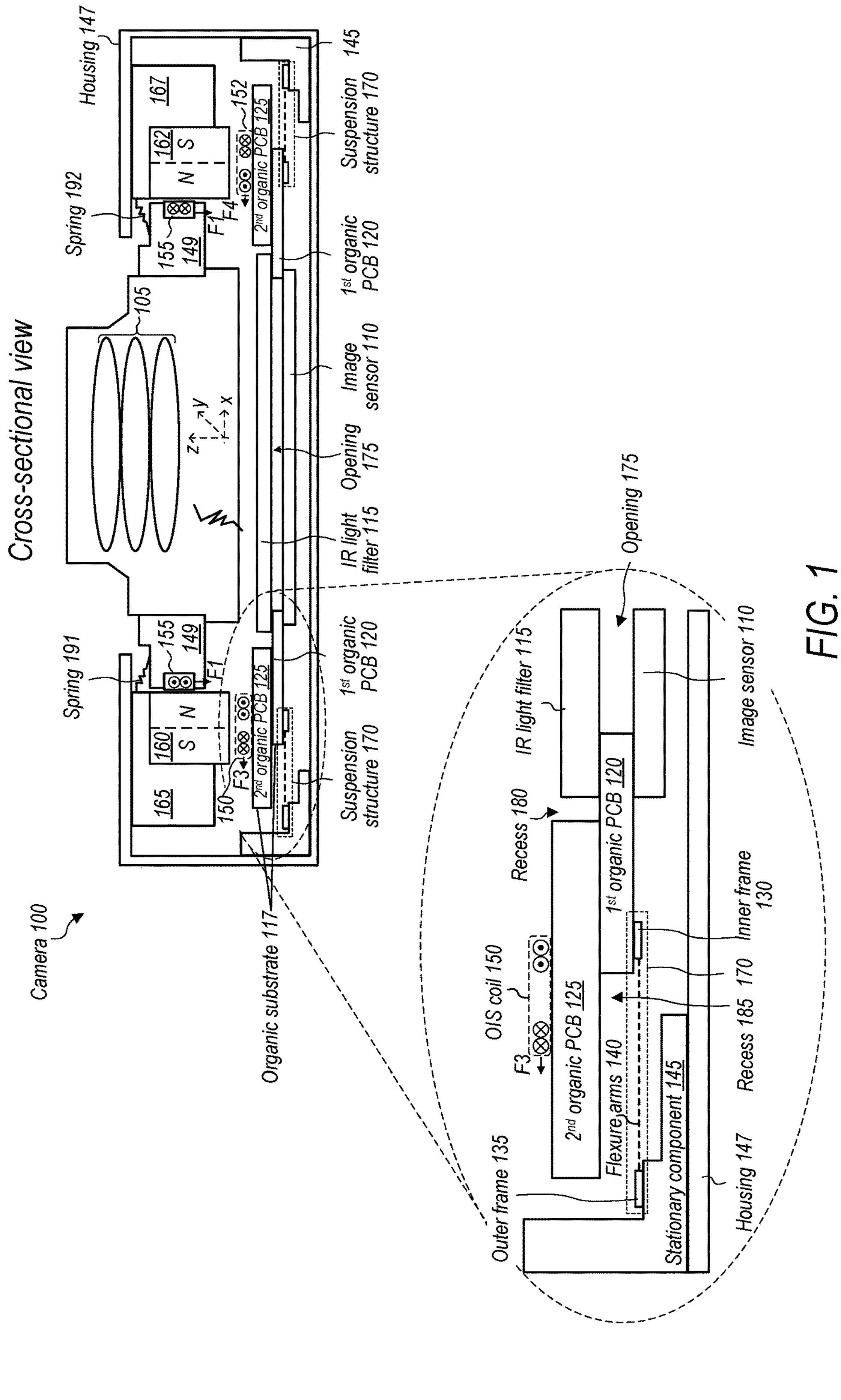
FIG. 1 is a simplified block diagram illustrating an example camera including an organic substrate for placement of one or more components, according to some embodiments.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

"Comprising." This term is open-ended. As used in the appended claims, this term does not foreclose additional structure or steps. Consider a claim that recites: "An apparatus comprising one or more processor units . . . " Such a claim does not foreclose the apparatus from including additional components (e.g., a network interface unit, graphics circuitry, etc.).

"Configured To." Various units, circuits, or other components may be described or claimed as "configured to" perform a task or tasks. In such contexts, "configured to" is used to connote structure by indicating that the units/circuits/components include structure (e.g., circuitry) that performs those task or tasks during operation. As such, the unit/circuit/component can be said to be configured to perform the task even when the specified unit/circuit/component is not currently operational (e.g., is not on). The units/circuits/components used with the "configured to" language include hardware—for example, circuits, memory storing program instructions executable to implement the operation, etc. Reciting that a unit/circuit/component is "configured to" perform one or more tasks is expressly intended not to invoke 35 U.S.C. § 112(f) for that unit/circuit/component. Additionally, "configured to" can include generic structure (e.g., generic circuitry) that is manipulated by software and/or firmware (e.g., an FPGA or a general-purpose processor executing software) to operate in manner that is capable of performing the task(s) at issue. "Configure to" may also include adapting a manufacturing process (e.g., a semiconductor fabrication facility) to fabricate devices (e.g., integrated circuits) that are adapted to implement or perform one or more tasks.

"First," "Second," etc. As used herein, these terms are used as labels for nouns that they precede, and do not imply any type of ordering (e.g., spatial, temporal, logical, etc.). For example, a buffer circuit may be described herein as performing write operations for "first" and "second" values. The terms "first" and "second" do not necessarily imply that the first value must be written before the second value.

"Based On." As used herein, this term is used to describe one or more factors that affect a determination. This term does not foreclose additional factors that may affect a determination. That is, a determination may be solely based on those factors or based, at least in part, on those factors. Consider the phrase "determine A based on B." While in this case, B is a factor that affects the determination of A, such a phrase does not foreclose the determination of A from also being based on C. In other instances, A may be determined based solely on B.

It will also be understood that, although the terms first, second, etc. may be used herein to describe various elements, these elements should not be limited by these terms. These terms are only used to distinguish one element from another. For example, a first contact could be termed a second contact, and, similarly, a second contact could be termed a first contact, without departing from the intended scope. The first contact and the second contact are both contacts, but they are not the same contact.

The terminology used in the description herein is for the purpose of describing particular embodiments only and is not intended to be limiting. As used in the description and the appended claims, the singular forms "a", "an" and "the"

are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context.

DETAILED DESCRIPTION

Various embodiments described herein relate to a camera including an organic substrate for placement of components. In some embodiments, the camera disclosed herein may include one or more lenses and an image sensor. In some embodiments, the image sensor may be placed at one side of an organic substrate. The image sensor may generate one or more image signals based on light passing through the one or more lenses along an optical axis (or Z-axis). The image signals may be further processed using a processor to produce one or more images. In some embodiments, one or more additional components of the camera may be also placed on the organic substrate. For instance, in some embodiments, the camera may include an infrared (IR) light filter mounted to another side of the substrate opposite the image sensor, such that the IR light filter may be positioned optically between the lenses and the image sensor along the optical axis (or Z-axis). As a result, the IR light filter may reduce or prevent IR light that passes through the lenses from reaching the image sensor. In some embodiments, the organic substrate may further include an opening through the organic material, positioned between the IR light filter and the image sensor, to allow light passing through the IR light filter to the image sensor through the opening. In some embodiments, the organic substrate may include a recess at the side facing or towards the lenses, such that the IR light filter may be placed least partially within the recess. In some embodiments, the camera may be integrated as part of a mobile multipurpose device, such as a smartphone, tablet, pad device, etc.

In some embodiments, the organic substrate may be a printed circuit board (or PCB) formed using one or more organic materials. For instance, the PCB may be formed using materials such as polyimide, ajinomoto build-up film (ABF), polytetrafluoroethylene (PTFE), polyetheretherketone (PEEK), flame retardant woven glass reinforced epoxy resin (FR-4), or other suitable organic materials. In some embodiments, the organic substrate may be formed using one single piece of PCB, or alternatively two or more discrete PCBs joined (e.g., soldered) together. In some embodiments, the organic substrate may include one more internal layers embedded within the organic substrate, one on top of another. In some embodiments, each of the internal layer may be used to route electrical traces or electrical wires to transfer electrical signals. In some embodiments, the electrical signals transferred through the electrical traces may include power, control, image signals, control signals, etc. In some embodiments, some or all of the electrical traces may be formed using copper or other suitable metallic materials.

In some embodiments, the camera may include a sensor-shift design such that the image sensor may be movable relative to the one or more lenses in one or more directions. For instance, in some embodiments, the camera may include a suspension structure that suspends the organic substrate (and the image sensor) from a stationary component of the camera. The suspension structure may be designed such that the organic substrate (and the image sensor) may have freedom to move in one or more directions (e.g., X- and/or Y-axis) orthogonal to the optical axis (or Z-axis). This may allow the camera to implement an OIS function, such as adjusting the position of the image sensor relative to the lenses laterally along the one or more directions (e.g., X- and/or Y-axis) to compensate for unwanted misalignment between the image sensor and the lenses. In addition, in some embodiments, the suspension structure may be designed, or the camera may include a separate suspension structure, that may allow the organic substrate (and the image sensor) to move longitudinally parallel to the optical axis (or Z-axis). This may allow the camera to adjust the focal distance between the image sensor and the lenses to perform AF. Alternatively, in some embodiments, the AF function may be implemented by moving the lenses, not the image sensor. For instance, in some embodiments, the camera may include a suspension structure that suspends the lenses (e.g., through a lens holder) from a stationary component such that the lenses may move relative to the image sensor longitudinally along the optical axis (or Z-axis). Moreover, in some embodiments, the camera may not include an AF function, and the focal distance between the image sensor and the lenses may stay fixed. In some embodiments, the movement of the image sensor and/or the lenses may be implemented using one or more actuators (e.g., OIS and AF actuator(s)), such as voice coil motor (VCM) actuator(s).

Sometimes cameras in mobile multipurpose devices may use hybrid substrates, such as substrates including both organic and ceramic portions that joined together. Compared to the hybrid substrates, the organic substrate in this disclosure may provide several benefits. One, because the organic substrate may be formed using merely one organic material, sourcing and manufacturing processes of the substrate may be simplified. This may improve reliability of the substrate. Two, the organic substrate may be formed using one single piece of organic PCB. This may eliminate the additional joining process of organic and ceramic portions that is required for hybrid substrates. This again may simplify the manufacturing process and thus improve the substrate reliability. Three, the assembly process of the organic substrate, such as placement of components on to the substrate, may require one or more reflow processes at temperatures. In hybrid substrates, the organic and ceramic portions may expand and compress differently at the temperatures because of their dissimilar thermal properties. This may create warpage at the joint and reliability problems. In contrast, when the organic substrate is formed using a same organic material, or only one single piece of PCB, warpage at the joint may be greatly reduced or even eliminated. Accordingly, reliability of the substrate may be improved. Four, manufacturing of some ceramic materials such as high-temperature co-fired ceramics (HTCC) may require high co-firing temperatures. As a result, only certain metallic materials such as tungsten, molybdenum, or manganese may have to be used to form electrical traces embedded within the ceramic portions. By comparison, the organic substrate may not necessarily have such requirements. Thus, materials such as copper with better electrical properties (e.g., higher electrical conductivity, higher thermal conductivity, etc.) may be used, e.g., for routing electrical signal traces for electronic components couple to the substrate. For example, copper signal traces may be used on throughout the entire substrate, as opposed a tungsten alloy for signal traces in the ceramic portion of a hybrid substrate. In addition to improved signal integrity, the use of copper traces also provides for better thermal characteristics. In some embodiments heat dissipation within a camera module using an organic substrate with all Cu for circuitry is improved compared to when using a hybrid ceramic substrate using CuW material for circuitry. In some cases this difference may provide 2-3° C. reduction in image sensor temperature which in turn may improve image quality. Further, organic materials may generally have better dielectric constants than ceramic materials. Thus, transmission of electrical signals through the body of the organic substrate, and signal integrity may be greatly enhanced. Further, organic materials may generally be lighter than ceramic materials. As to the sensor-shift design, this may reduce the weight of the substrate (e.g., one of the movable components), lower power requirements for the actuator(s), increase the actuation response and thus the OIS and/or AF performance of the camera. Furthermore, ceramic materials may generally be more brittle and thus more prone to crack than organic materials. Thus, use of the organic substrate may lower fracture chances and increase reliability. In addition, because organic materials are less fragile than ceramic materials, it may be easier to create vias through the organic substrate. This may simplify or improve routing of electrical traces, and thus increase reliability and performance of the camera.

FIG. 1 is a simplified block diagram illustrating an example camera including an organic substrate for placement of one or more components, according to some embodiments. For purposes of illustration, an optical coordinate system defined by X-Y-Z axes is displayed in FIG. 1, where an optical axis of one or more lenses of the camera is defined as Z-axis. In some embodiments, the optical axis (or Z-axis) may correspond to the transmission path of a principal light ray passing through the lenses to an image sensor of the camera. In some embodiments, the transmission path of the principal light ray within the camera may not necessary be a straight but rather a folded line, e.g., when the camera includes a light folding element that may change the transmission direction of the principal light ray. In that case, the optical axis may refer to any straight portion of the folded line. Further, for purposes of illustration, only relevant components of the camera are shown in the cross-sectional view of the camera in FIG. 1.

As indicated in FIG. 1, in some embodiments, camera 100 may include one or more lenses 105 and image sensor 110. In some embodiments, image sensor 110 may be placed at one side of organic substrate 117. In some embodiments, organic substrate 117 of camera 100 may include two or more separate organic printed circuit boards (PCBs), e.g., organic PCBs 120 and 125, that may be joined (e.g., soldered) together, as indicated in FIG. 1. Alternatively, in some embodiments, the organic substrate of camera 100 may be one single price of an organic PCB, as described below in FIGS. 2-3. In this example, image sensor 110 generate one or more image signals based on light passing through one or more lenses 105 along the optical axis (or Z-axis). The image signals may be further processed using a processor to produce one or more images. In some embodiments, one or more lenses 105 may be contained inside lens holder 149. For instance, lens holder 149 may include interior threads, and lenses 105 may be individually screwed to the threads to become affixed with lens holder 149. In some embodiments, one or more additional components of camera 100 may be also placed on organic substrate 117. For instance, in some embodiments, camera 100 may include infrared (IR) light filter 115 mounted to another side of organic PCB 120 of organic substrate 117 that is opposite the side of organic PCB 120 where image sensor 110 may be mounted. As a result, IR light filter 115 may be positioned optically between lenses 105 and image sensor 110 along the optical axis (or Z-axis). Thus, IR light filter 115 may reduce or prevent IR light that passes through lenses 105 from reaching image sensor 110. In some embodiments, organic PCB 120 of organic substrate 117 may further include opening 175 through the body of organic PCB 120, positioned between IR light filter 115 and image sensor 110, to allow light passing through IR light filter 115 to image sensor 110 through opening 175. In some embodiments, organic PCB 120 of organic substrate 117 may include recess 180 (e.g., a cavity or pocket) at the side where IR light filter is mounted, e.g., at least partially overlapping opening 175, such that IR light filter 115 may be placed at least partially within recess 180 of organic PCB 120. Recess 180 may reduce thickness of organic substrate 117 in the area of recess 180 relative to other portions of organic substrate 117, and thus lower the height (also called Z-height) of the overall substrate assembly (including organic substrate 117 and components placed on the organic substrate such as IR light filter 115) along the optical axis (or Z-axis). The Z-height decrease may help to reduce the size of camera 100.

In some embodiments, organic substrate 117 of camera 100 (e.g., including organic PCBs 120 and 125) may be formed using one or more organic materials, such as polyimide, ajinomoto build-up film (ABF), polytetrafluoroethylene (PTFE), polyetheretherketone (PEEK), flame retardant woven glass reinforced epoxy resin (FR-4), or other suitable organic materials. In some embodiments, organic substrate 117 (e.g., organic PCBs 120 and/or 125) may include one more layers or laminations embedded within organic substrate 117, one on top of another. In some embodiments, each of the layer or lamination may be used to route electrical traces for transferring electrical signals. In some embodiments, the electrical signals may include power, ground, and image signals to/from image sensor 110 and other components on the organic substrate. In addition, in some embodiments, the electrical signals may include control and sensing signals to/from other components of on organic substrate 117 to implement OIS and/or AF functions. In some embodiments, some or all of the electrical traces may be formed using copper or other suitable metallic materials. In some embodiments, organic substrate 117 may be part of a rigid-flex circuit. A rigid-flex circuit may refer to a printed circuit including one or more rigid printed circuit boards and one or more flexible printed circuit boards. Some layers of the rigid and flexible printed circuit boards may be connected with each other, such that electrical traces may be continuously routed across the rigid and flexible portions. In that case, organic substrate 117 (as part of a rigid-flex circuit) may be further connected with one or more flexible printed circuits (as another part of the rigid-flex circuit) that may route electrical traces of organic substrate 117 to other rigid printed circuits ((as yet another part of the rigid-flex circuit) and/or other components outside organic substrate 117.

In some embodiments, camera 100 may include a sensor-shift design such that image sensor 110 may be movable relative to lenses 105 in one or more directions. For instance, in some embodiments, camera 100 may include suspension structure 170 that suspends organic PCB 120 of organic substrate 117 (and image sensor 110) from stationary component 145 that is further attached with housing 147 of camera 100. In some embodiments, suspension structure 170 may include inner frame 130 and outer frame 135, two of which may be connected through one or more flexure arms 140. In some embodiments, inner frame 130 may be attached to organic PCB 120, whilst outer frame 135 may be affixed to stationary component 145. As indicated in FIG. 1, in some embodiments, suspension structure 170 may be arranged within a plane (e.g., X-Y plane) orthogonal to the optical axis (or Z-axis). Thus, the compression and stretch of flexure arms 140 may allow organic PCB 120 (and image sensor 110) to move within the plane along X and/or Y-axis orthogonal to the optical axis (or Z-axis).

In some embodiments, camera 100 may include an actuator, such as a VCM actuator, to implement movement of image sensor 1210. Given the movement is in the lateral direction(s) orthogonal to the optical axis (or Z-axis), this actuator is also called the OIS actuator in this disclosure. As indicated in FIG. 1, in some embodiments, the OIS actuator may include one or more OIS coils 150 and 152 that may be attached to organic PCB 125 of organic substrate 117, and one or more magnets 160 and 162 that may be affixed with stationary components 165 and 167 that are further attached with housing 147 of camera 100. Camera 100 may use one or more controllers to regulate current flowing through OIS coils 150 and 152, which may interact with the magnetic fields of magnets 160 and 162 to generate motive force (e.g., Lorentz force) F3 and F4 to move OIS coils 150 and 152 (together with organic PCBs 120 and 125, and image sensor 110). In FIG. 1, the dot in the circle within OIS coil 150, and the cross in the circle within OIS coil 152, may respectively indicate current through the respective OIS coils into and out of the paper. Thus, given the directions of the current of OIS coils 150 and 152, and the polarities of the magnetic fields of magnets 160 and 162, the motive force F3 and F4 may be in the negative direction of X-axis. Thus, image sensor 110 may be moved relative to lenses 105 towards the negative direction of X-axis under the motive force F3 and F4. Accordingly, when the directions of the current of OIS coils 150 and 152 are reversed by the one or more controllers, the directions of the motive force F3 and F4 may change to the positive direction of X-axis. Thus, image sensor 110 may be moved relative to lenses 105 towards the positive direction of X-axis. The amplitudes of the current in OIS coils 150 and 152 may also regulated to control the amplitudes of the motive force F3 and F4. In some embodiments, organic substrate 117 may include another recess 185, e.g., around a periphery near the edge of organic PCB 125. Recess 185 may provide extra spacing between PCB organic 125 and flexure arms 140, such that they may not unexpectedly move and collide with each other in a direction parallel to the optical axis (or Z-axis), e.g., during drop or shake of camera 100. In some embodiments, one or more components distinct from image sensor 110 and IR light filter 115, such as the OIS coils, controller(s) of the OIS actuator, and/or position sensor, may be attached to organic PCB 125 at the bottom side to utilize the readily-available spacing beneath the organic substrate to reduce the Z-height of the overall substrate assembly.

Note that the cross-sectional view in FIG. 1 only illustrates the structure of camera 100 within the X-Z plane. In some embodiments, the OIS actuator of camera 100 may include one or more additional OIS coils (like OIS coils 150 and 152) and one or more magnets (like magnets 160 and 162) in a cross-sectional view within another plane (e.g., Y-Z plane). Similarly, image sensor 110 may be moved relative to lenses 105 in another direction (e.g., Y-axis) orthogonal to the optical axis (or Z-axis). In short, camera 100 may use the OIS actuator to move image sensor 110 relative to lenses 105 laterally in one or more directions (e.g., along X- and/or Y-axis) orthogonal to the optical axis (or Z-axis) to implement an OIS function. In addition, in some embodiments, camera 100 may have an additional and/or different suspensions structure (not shown in FIG. 1) such that image sensor 110 may be movable relative to lenses 105 longitudinally parallel to the optical axis (or Z-axis). This may allow camera 100 to adjust the focal distance between image sensor 110 and lenses 105 to perform AF.

In addition, in some embodiments, lenses 105 may be also movable. For instance, in some embodiments, as indicated in FIG. 1, camera 100 may include a suspension structure having one or more springs 191 and 192 to suspend lens holder 149 (and thus lenses 105) from stationary components 165 and 167 of camera 100. Compression and stretch of springs 191 and 192 may allow lens holder 149 (and lenses 105) to move relative to image sensor 110 longitudinally in a directional parallel to the optical axis (or Z-axis), thus the focal distance between lenses 105 and image sensor 110 may be adjusted. In some embodiments, camera 100 may include an actuator, e.g., such as a VCM actuator, to implement the motion of lenses 105. In this disclosure, this actuator is also called the AF actuator. For instance, as indicated in FIG. 1, in some embodiments, the AF actuator may include one or more AF coils 155 that may be affixed with lens holder 149. In some embodiments, AF coils 155 may be wound around the periphery of lenses 105 within a plane (e.g., X-Y plane) orthogonal to the optical axis (or Z-axis). As indicated in FIG. 1, current flowing through AF coils 105 may interact with the magnetic fields of magnets 160 and 162 to generate motive force (e.g., Lorentz force) F1 to move lenses 105 relative to image sensor 110 in the negative direction of the optical axis (or Z-axis). Similarly, the polarities and/or amplitudes of the current of AF coils 155 may be regulated such that the direction and/or amplitude of the motive force (e.g., Lorentz force) F1 may be controlled to adjust the focal distance between lenses 105 and image sensor 110 along the optical axis (or Z-axis). Alternatively, in some embodiments, camera 100 may not have an AF function, and the focal distance between image sensor 110 and lenses 105 may stay fixed.

Figure 2:
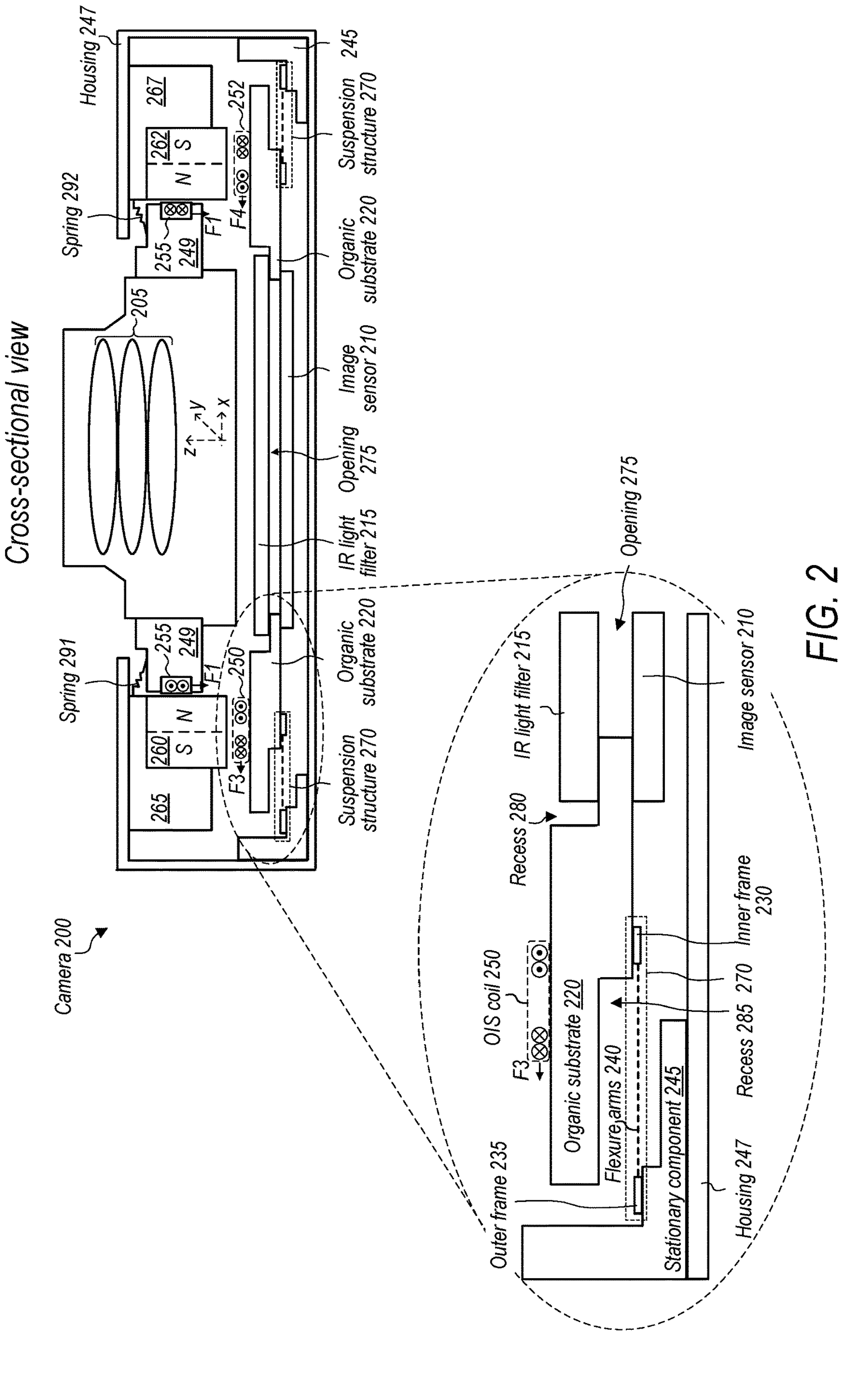
FIG. 2 is a simplified block diagram illustrating another example camera including an organic substrate for placement of one or more components, according to some embodiments.

FIG. 2 is a simplified block diagram illustrating another example camera including an organic substrate for placement of one or more components, according to some embodiments. As indicated in FIG. 2, camera 200 may have a similar design as camera 100, but with some difference. For instance, in some embodiments, camera 200 may also include one or more lenses 205 and image sensor 210, like lenses 105 and image sensor 110 of camera 100. Similarly, image sensor 210 may be placed at one side of organic substrate 220, and IR light filter 115 on the opposite side of organic substrate 220 facing or towards lenses 205, such that IR light filter 115 may become optically positioned between lenses 205 and image sensor 210 to block or prevent IR light from reaching image sensor 210. Unlike organic substrate 117 of camera 100, organic substrate 220 of camera 200 may be one single piece of an organic PCB. As indicated in FIG. 2, in the cross-sectional view within the X-Z plane, the geometry of an approximately half portion of organic substrate 220 may appear as a Z-shape, with a first recess 280 at the same side of organic substrate 220 as IR light filter 215, at a position overlapping image sensor 210, and a second recess 285 at the opposite side of organic substrate 220 around the periphery of organic substrate 220 proximate the edge of the organic substrate. IR light filter 215 may be placed at least partially within recess 280, so that the Z-height of the overall substrate assembly may not be increased significantly by the IR light filter. In addition, organic substrate 220 may further include opening 275 through the body of organic substrate 220, positioned between IR light filter 215 and image sensor 210, to enable light passing through IR light filter 215 to reach image sensor 210 through opening 275.

Similarly, in some embodiments, organic substrate 220 may be formed using one or more organic materials, such as polyimide, ajinomoto build-up film (ABF), polytetrafluoroethylene (PTFE), polyetheretherketone (PEEK), flame retardant woven glass reinforced epoxy resin (FR-4), or other suitable organic materials. In addition, in some embodiments, organic substrate 220 may include one or more layers inside organic substrate 220 that may be used to route electrical traces for transferring various electrical signals. In some embodiments, some or all of the electrical traces may be formed using copper.

Like camera 100, camera 200 may also include a sensor-shift design where organic substrate 220 and image sensor 210 may be moved, e.g., using an OIS actuator, relative to lenses 205 in one or more directional (e.g., X- and/or Y-axis) orthogonal to the optical axis (or Z-axis). For instance, as indicated in FIG. 2, camera 200 may include suspension structure 270 including inner frame 230, outer frame 235, and one or more flexure arms 240. Like suspension structure 170 of camera 100, suspension structure 270 may suspend organic substrate 220 and image sensor 210 from stationary component 245 of camera 200 to enable the movability of organic substrate 220 and image sensor 210. Further, the OIS actuator may include one or more OIS coils 250 and 252 (like OIS coils 150 and 152), and one or more magnets 260 and 262 (like magnets 160 and 162). Like the OIS actuator of camera 100, the OIS actuator of camera 200 may operate in the similar manner to move organic substrate 220 and image sensor 210 relative to lenses 205 laterally in one or more directions (e.g., X- and/or Y-axis) orthogonal to the optical axis (or Z-axis) to perform OIS. In addition, in some embodiments, camera 200 may be able to move image sensor 210 relative to lenses 205 longitudinally parallel to the optical axis (or Z-axis) to perform AF.

Similar to camera 100, in some embodiments, camera 200 may also be able to move lenses 205, e.g., in a direction parallel to the optical axis (or Z-axis). For instance, as indicated in FIG. 2, in some embodiments, camera 200 may include a suspension structure having springs 291 and 292 (like springs 191 and 192) to suspend lens holder 249 and lenses 205 from stationary component 265 and 267 of camera 200. Further, camera 200 may include an AF actuator having one or more AF coils 255 (like AF coils 155). Like camera 100, camera 200 may use the AF actuator to move lenses 205 relative to image sensor 210 longitudinally parallel to the optical axis (or Z-axis) to implement the AF function. In some embodiments, camera 200 may not have an AF function, and the focal distance between image sensor 210 and lenses 205 may stay fixed.

Figure 3:
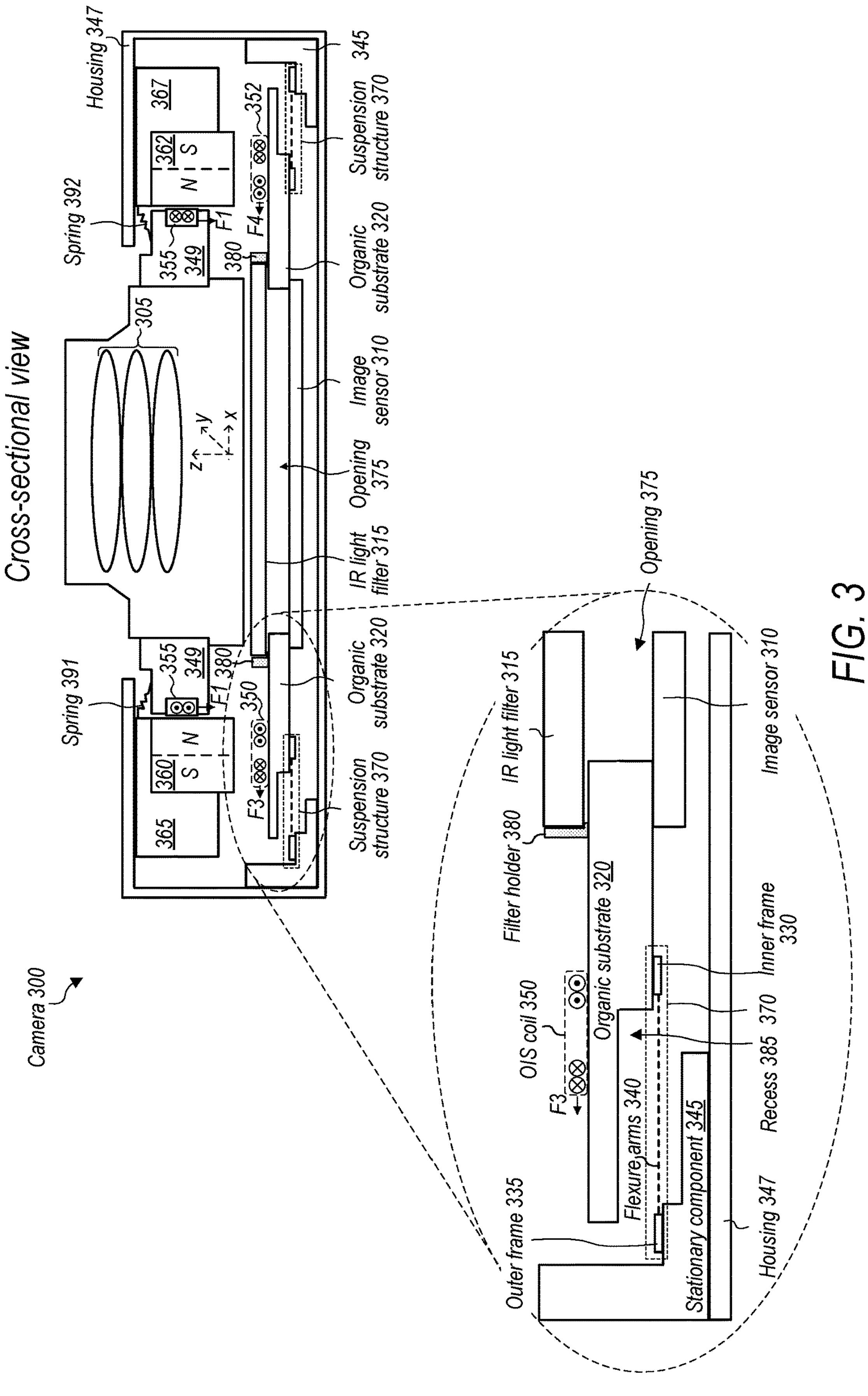
FIG. 3 is a simplified block diagram illustrating yet another example camera including an organic substrate for placement of one or more components, according to some embodiments.

FIG. 3 is a simplified block diagram illustrating yet another example camera including an organic substrate for placement of one or more components, according to some embodiments. As indicated in FIG. 3, camera 300 may have a similar design as cameras 100 and 200, but with some difference. For instance, in some embodiments, camera 300 may also include one or more lenses 305 and image sensor 310, like cameras 100 and 200. Similarly, image sensor 310 may be placed at one side of organic substrate 320, and IR light filter 315 on the opposite side of organic substrate 320 facing or towards lenses 305, such that IR light filter 315 may become optically positioned between lenses 305 and image sensor 310 to block or prevent IR light from reaching image sensor 310. Unlike organic substrate 117 of camera 100, organic substrate 320 of camera 300 may be one single piece of an organic PCB. Further different from organic substrate 220 of camera 200, organic substrate 320 may not include a recess (like recess 280) for placing IR light filter 315. Instead, IR light filter 315 may be attached on a surface at the top side of organic substrate 310. Thus, as indicated in FIG. 3, in the cross-sectional view within the X-Z plane, the geometry of an approximately half portion of organic substrate 320 may appear as an inversed L-shape, with only recess 385 at the same side of organic substrate 220 as image sensor 310 around the periphery of organic substrate 320 proximate the edge of the organic substrate. IR light filter 315 may be attached to organic substrate 320 using glues, or alternatively using filter holder 380. In addition, organic substrate 320 may further include opening 375 through the body of organic substrate 320, positioned between IR light filter 315 and image sensor 310, to enable light passing through IR light filter 315 to reach image sensor 310 through opening 375.

Similarly, in some embodiments, organic substrate 320 may be formed using one or more organic materials, such as polyimide, ajinomoto build-up film (ABF), polytetrafluoroethylene (PTFE), polyetheretherketone (PEEK), flame retardant woven glass reinforced epoxy resin (FR-4), or other suitable organic materials. In addition, in some embodiments, organic substrate 320 may include one or more layers inside organic substrate 320 that may be used to route electrical traces for transferring various electrical signals. In some embodiments, some or all of the electrical traces may be formed using copper.

Like cameras 100 and 200, camera 300 may also include a sensor-shift design where organic substrate 320 and image sensor 310 may be moved, e.g., using an OIS actuator, relative to lenses 305 in one or more directional (e.g., X- and/or Y-axis) orthogonal to the optical axis (or Z-axis). For instance, as indicated in FIG. 3, camera 300 may include suspension structure 370 including inner frame 330, outer frame 335, and one or more flexure arms 340. Like suspension structures 170 and 270, suspension structure 370 may suspend organic substrate 320 and image sensor 310 from stationary component 345 of camera 300. Further, the OIS actuator may include one or more OIS coils 350 and 352 (like OIS coils 150-152 and 250-252), and one or more magnets 360 and 362 (like magnets 160-162 and 260-262). Like the OIS actuators of cameras 100 and 200, the OIS actuator of camera 300 may operate in the similar manner to move organic substrate 320 and image sensor 310 relative to lenses 305 laterally in one or more directions (e.g., X- and/or Y-axis) orthogonal to the optical axis (or Z-axis) to perform OIS. In addition, in some embodiments, camera 300 may be able to move image sensor 310 relative to lenses 305 longitudinally parallel to the optical axis (or Z-axis) to perform AF.

Similar to cameras 100 and 200, in some embodiments, camera 300 may also be able to move lenses 305, e.g., in a direction parallel to the optical axis (or Z-axis). For instance, as indicated in FIG. 3, in some embodiments, camera 300 may include a suspension structure having springs 391 and 392 (like springs 191-192 and 291-292) to suspend lens holder 349 and lenses 305 from stationary component 365 and 367 of camera 300. Further, camera 300 may include an AF actuator having one or more AF coils 355 (like AF coils 155 and 255). Like cameras 100 and 200, camera 300 may use the AF actuator to move lenses 305 relative to image sensor 310 longitudinally parallel to the optical axis (or Z-axis) to implement the AF function. In some embodiments, camera 300 may not have an AF function, and the focal distance between image sensor 310 and lenses 305 may stay fixed.

In addition to the benefits described above, the variations in the design of cameras 100, 200, and 300 may provide further features, according to some embodiments. For instance, in some embodiments, compared to a "benchmark" hybrid substrate including an organic PCB and a ceramic PCB, camera 100 that includes organic substrate 117 having multiple separate organic PCBs 120 and 125 joined together may accommodate the same number of layers as the hybrid substrate but with a reduced Z-height. In some embodiments, camera 200 that includes a Z-shape organic substrate 220 may have more embedded layers than the hybrid substrate. In some embodiments, camera 300 that includes a L-shape organic substrate 320 may transfer the same amount of electrical signals as the hybrid substrate under an approximately same Z-height, but using a less number of embedded layers even mounting an IR light filter at the surface of the organic substrate. Further, because the L-shape organic substrate 320 in camera 300 eliminates one recess at the side of the organic substrate towards the lenses, it may be easier to apply a silicon resin (SR) coating to cover the organic substrate. The SR coating may protect particles falling from the organic substrate to reach other components of the camera. In some embodiments, the particles on a lens, image sensor, and/or IR light filter may negatively impact quality of the generated images. They may also cause reliability problems.

Figure 4:
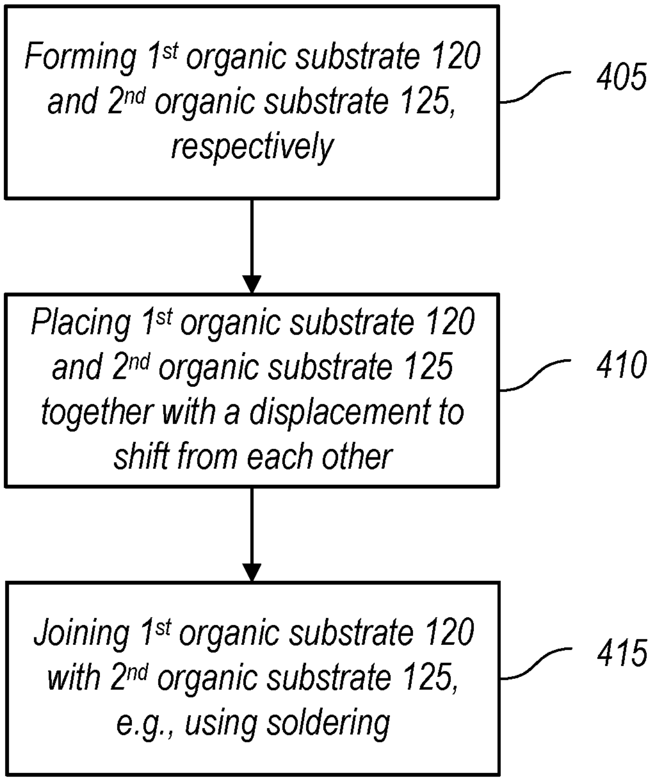
FIG. 4 shows an example technique for forming an organic substrate, according to some embodiments.

The organic substrates in FIGS. 1-3 (e.g., organic substrates 117, 220, and 320) may be formed using one of different suitable techniques. FIG. 4 shows an example technique for forming organic substrate 117 of FIG. 1. As indicated in FIG. 4, since organic substrate 117 two separate organic substrates 120 and 125, the two organic substrates 120 and 125 may be first formed respectively, as indicated in block 405. As described above, in some embodiments, organic substrate 120 and 125 may respectively include one or more layers, and electric traces at those layers for routing electrical signature. Thus, each of the two organic substrates may be formed in a sequential order layer by layer. Further, the electrical traces may be copper wires. Moreover, opening 175 may be formed through the body of the first organic substrate 120. In some embodiments, opening 175 may be created by cutting the opening through the first organic substrate 120 using laser. Next, as indicated in FIG. 1, organic substate 117 may include recesses 180 and 185. Thus, the two organic substrates 120 and 125 may be placed together, next to each other, with a displacement such that the two organic substrates 120 and 125 may shift from each other to create recesses 180 and 185, at indicated in block 410. Finally, the two organic substrates 120 and 125 may be joined together, e.g., using soldering. For instance, the two organic substrates 120 and 125 may respectively include electrical traces that need to be soldered together. When the two organic substrates 120 and 125 are placed together in block 410, these electrical traces may be aligned with each other and thus get soldered together in block 415.

Figure 5:
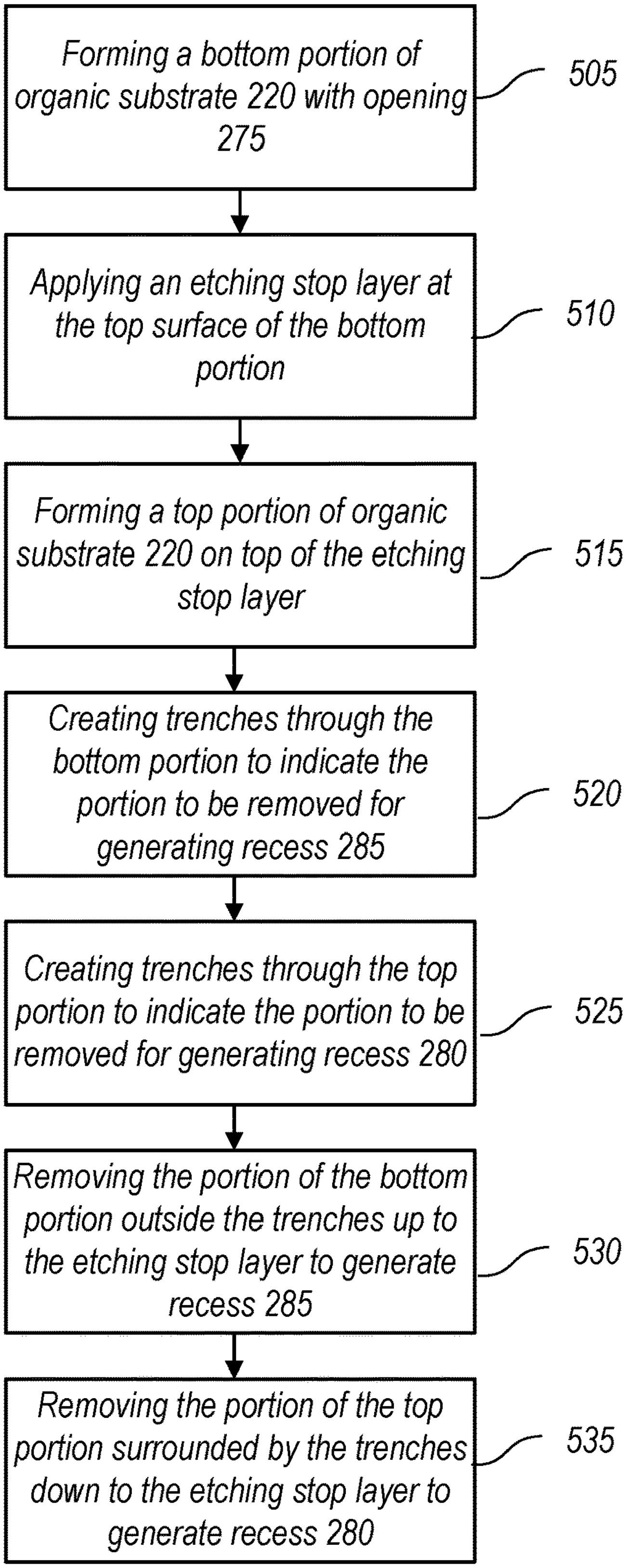
FIG. 5 shows another example technique for forming an organic substrate, according to some embodiments.

FIG. 5 shows an example technique for forming organic substrate 220 of FIG. 2. Unlike organic substrate 117 of FIG. 1, organic substrate 220 of FIG. 2 may be one integral piece of an organic substrate. As indicated in FIG. 5, a bottom portion of organic substrate 220 may be formed first, as indicated in block 505. Note that, to simplify description, it refers to the portion of organic substrate 220 in FIG. 2, a portion of which is to be removed in subsequent step(s) to generate recess 285 (e.g., block 530), as the bottom portion. By comparison, the other portion of organic substrate 220 in FIG. 2, a portion of which is to be removed in the subsequent step(s) to generate recess 280, as the top portion. Further, the bottom portion formed in block 505 may originally include the portion that is to be removed for generating recess 285. Moreover, opening 275 may be created through the body of the bottom portion of organic substrate 220, e.g., using laser. In addition, similar to the technique in FIG. 4, the bottom portion of organic substrate 220 may include one or more layers where electrical traces may be routed.

Referring back to FIG. 5, as indicated in block 510, an etching stop layer may be applied to the top surface of the bottom portion of organic substrate 220. The etching layer may include a layer of etching resistant material which may stop etching in the subsequent step(s) when forming recesses 280 and 285 (e.g., blocks 530 and 535). Next, a top portion of organic substrate 220 may be formed on top of the etching stop layer (and on top of the bottom portion as well), as indicated in block 515. Similarly, the top portion of organic substrate 220 may also include one or more layers for routing electrical traces.

One or more trenches may be created through the bottom portion of organic substrate 220, respectively, e.g., using laser, to indicate the portion of the bottom portion of organic substrate 220 that is to be removed for generating recesses 285, as indicated in block 520. For instance, like creating opening 275, trenches may be created by cutting though the bottom portion. But unlike opening 275, the laser may not cut through the entire body of the bottom portion, but rather stops at the etching stop layer at the top surface of the bottom portion. The trenches may be formed in the plane perpendicular to the etching stop layer, at edges of the bottom portion of organic substrate 220 after recess 285 is formed as shown in FIG. 2. In other words, the portion of the bottom portion of organic substrate 220 outside the trenches needs to be removed in order to form recess 285. Similarly, trenches may be created, e.g., using laser, through the top portion of organic substrate 220 to indicate the portion of the top portion that needs to be removed for generating recess 280, as indicated in block 525. The portion of the top portion of organic substrate 220 surrounded by (e.g., inside) the trenches may be removed for creating recess 280. Again, these trenches may cut down to the etching stop layer.

As indicated in blocks 530 and 535, one or more etching processes may be applied to the bottom and top portions of organic substrate 220 to remove the portions indicated by previously-formed trenches to create recesses 285 and 280. In other words, one or more layers of organic substrate 220 (within the removed portions) may be selectively removed to form the two recesses.

Figure 6:
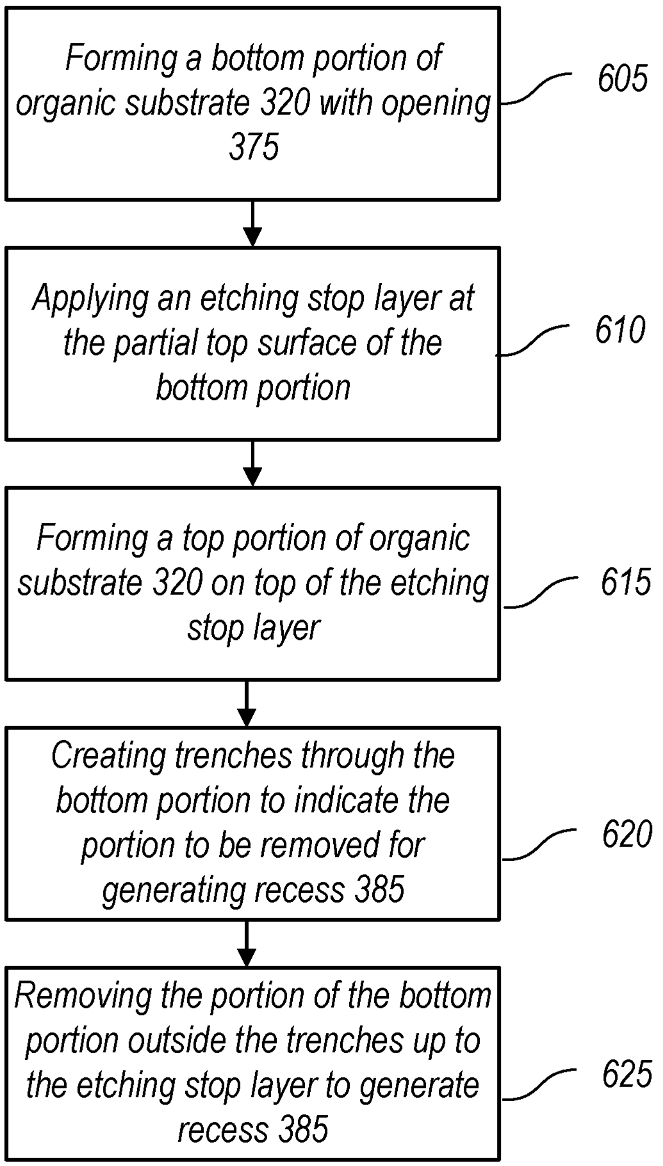
FIG. 6 shows still another example technique for forming an organic substrate, according to some embodiments.

FIG. 6 shows an example technique for forming organic substrate 320 of FIG. 3. As indicated in block 605, a bottom portion of organic substrate 320 may be first formed. In addition, opening 375 may be created through the body of the bottom portion, e.g., using laser. Further, as described above, the bottom portion of organic substate 320 may include one or more layers for routing electrical traces. Next, an etching stop layer may be applied at the top surface of the bottom portion of organic substrate 320, as indicated in block 610. Further, because only one portion of the bottom portion needs to be removed in order to create recess 385, the etching stop layer may be formed to cover only the partial area of the top surface corresponding to the portion that needs to be removed for creating recess 385.

As indicated in block 615, a top portion of organic substrate 320 may be formed on top of the etching stop layer. The top portion of organic substrate 220 may also include one or more layers for routing electrical traces Moreover, as indicated in block 620, trenches may be created through the bottom portion of organic substrate 320 to indicate the portion of the bottom portion to be removed for generating recess 385, as described above in FIG. 5. As indicated in block 625, an etching process may be applied to remove the portion of the bottom portion of organic substrate 320, outside the trenches, to generate recess 385.

Figure 7:
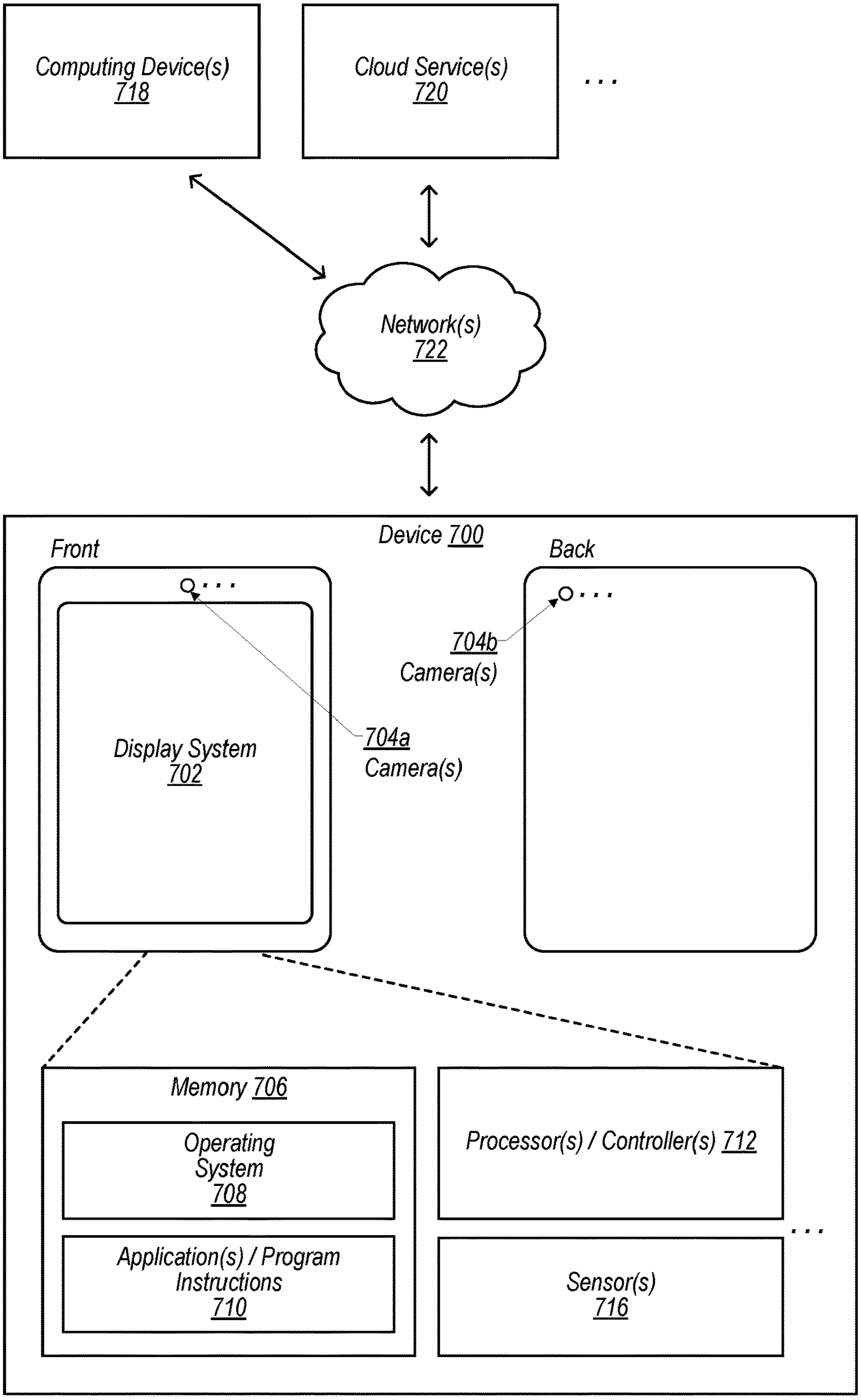
FIG. 7 shows a schematic representation of an example device that may include a camera having an organic substrate for placement of one or more components, according to some embodiments.

FIG. 7 illustrates a schematic representation of an example device 700 that may include a camera (e.g., cameras 100, 200, and 300 described above), according to some embodiments. In some embodiments, the device 700 may be a mobile device and/or a multifunction device. In various embodiments, the device 700 may be any of various types of devices, including, but not limited to, a personal computer system, desktop computer, laptop, notebook, tablet, slate, pad, or netbook computer, mainframe computer system, handheld computer, workstation, network computer, a camera, a set top box, a mobile device, an augmented reality (AR) and/or virtual reality (VR) headset, a consumer device, video game console, handheld video game device, application server, storage device, a television, a video recording device, a peripheral device such as a switch, modem, router, or in general any type of computing or electronic device.

In some embodiments, the device 700 may include a display system 702 (e.g., comprising a display and/or a touch-sensitive surface) and/or one or more cameras 704. In some non-limiting embodiments, the display system 702 and/or one or more front-facing cameras 704*a* may be provided at a front side of the device 700, e.g., as indicated in FIG. 7. Additionally, or alternatively, one or more rear-facing cameras 704*b* may be provided at a rear side of the device 700. In some embodiments comprising multiple cameras 704, some or all of the cameras may be the same as, or similar to, each other. Additionally, or alternatively, some or all of the cameras may be different from each other. In various embodiments, the location(s) and/or arrangement(s) of the camera(s) 704 may be different than those indicated in FIG. 7.

Among other things, the device 700 may include memory 706 (e.g., comprising an operating system 708 and/or application(s)/program instructions 710), one or more processors and/or controllers 712 (e.g., comprising CPU(s), memory controller(s), display controller(s), and/or camera controller (s), etc.), and/or one or more sensors 716 (e.g., orientation sensor(s), proximity sensor(s), and/or position sensor(s), etc.). In some embodiments, the device 700 may communicate with one or more other devices and/or services, such as computing device(s) 718, cloud service(s) 720, etc., via one or more networks 722. For example, the device 700 may include a network interface (e.g., network interface 810) that enables the device 700 to transmit data to, and receive data from, the network(s) 722. Additionally, or alternatively, the device 700 may be capable of communicating with other devices via wireless communication using any of a variety of communications standards, protocols, and/or technologies.

Figure 8:
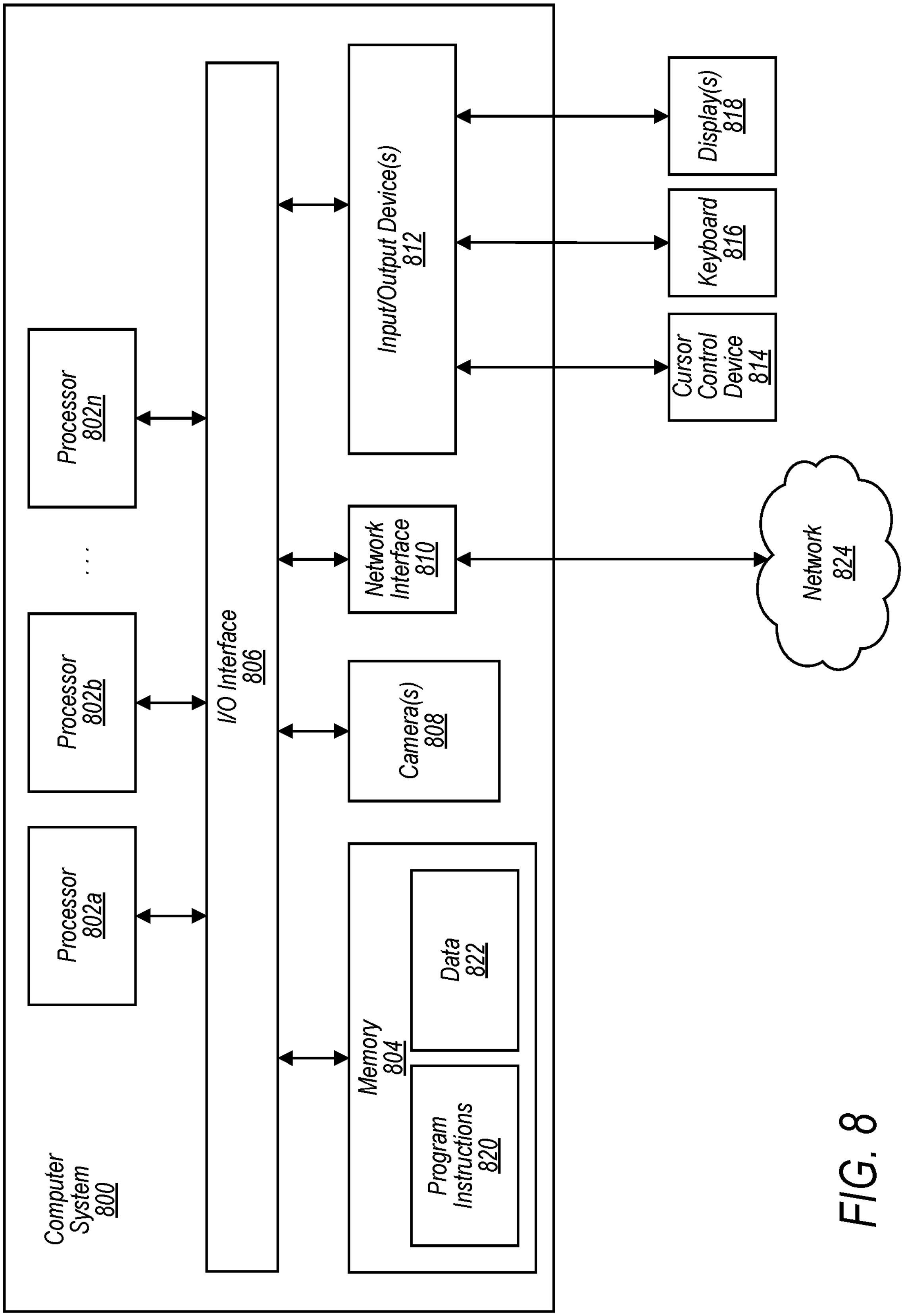
FIG. 8 shows a schematic block diagram of an example computer system that that may include or host embodiments of a camera having an organic substrate for placement of components, according to some embodiments.

FIG. 8 illustrates a schematic block diagram of an example computing device, referred to as computer system 800, that may include or host embodiments of a camera having an organic substrate for placement of components, e.g., as described herein with reference to FIGS. 1-7, according to some embodiments. In addition, computer system 800 may implement methods for controlling operations of the camera and/or for performing image processing images captured with the camera. In some embodiments, the device 700 (described herein with reference to FIG. 7) may additionally, or alternatively, include some or all of the functional components of the computer system 800 described herein.

The computer system 800 may be configured to execute any or all of the embodiments described above. In different embodiments, computer system 800 may be any of various types of devices, including, but not limited to, a personal computer system, desktop computer, laptop, notebook, tablet, slate, pad, or netbook computer, mainframe computer system, handheld computer, workstation, network computer, a camera, a set top box, a mobile device, an augmented reality (AR) and/or virtual reality (VR) headset, a consumer device, video game console, handheld video game device, application server, storage device, a television, a video recording device, a peripheral device such as a switch, modem, router, or in general any type of computing or electronic device.

In the illustrated embodiment, computer system 800 includes one or more processors 802 coupled to a system memory 804 via an input/output (I/O) interface 806. Computer system 800 further includes one or more cameras 808 coupled to the I/O interface 806. Computer system 800 further includes a network interface 810 coupled to I/O interface 806, and one or more input/output devices 812, such as cursor control device 814, keyboard 816, and display(s) 818. In some cases, it is contemplated that embodiments may be implemented using a single instance of computer system 800, while in other embodiments multiple such systems, or multiple nodes making up computer system 800, may be configured to host different portions or instances of embodiments. For example, in one embodiment some elements may be implemented via one or more nodes of computer system 800 that are distinct from those nodes implementing other elements.

In various embodiments, computer system 800 may be a uniprocessor system including one processor 802, or a multiprocessor system including several processors 802 (e.g., two, four, eight, or another suitable number). Processors 802 may be any suitable processor capable of executing instructions. For example, in various embodiments processors 802 may be general-purpose or embedded processors implementing any of a variety of instruction set architectures (ISAs), such as the x86, PowerPC, SPARC, or MIPS ISAs, or any other suitable ISA. Also, in some embodiments, one or more of processors 802 may include additional types of processors, such as graphics processing units (GPUs), application specific integrated circuits (ASICs), etc. In multiprocessor systems, each of processors 802 may commonly, but not necessarily, implement the same ISA. In some embodiments, computer system 800 may be implemented as a system on a chip (SoC). For example, in some embodiments, processors 802, memory 804, I/O interface 806 (e.g. a fabric), etc. may be implemented in a single SoC comprising multiple components integrated into a single chip. For example, an SoC may include multiple CPU cores, a multi-core GPU, a multi-core neural engine, cache, one or more memories, etc. integrated into a single chip. In some embodiments, an SoC embodiment may implement a reduced instruction set computing (RISC) architecture, or any other suitable architecture.

System memory 804 may be configured to store program instructions 820 accessible by processor 802. In various embodiments, system memory 804 may be implemented using any suitable memory technology, such as static random access memory (SRAM), synchronous dynamic RAM (SDRAM), nonvolatile/Flash-type memory, or any other type of memory. Additionally, existing camera control data 822 of memory 804 may include any of the information or data structures described above. In some embodiments, program instructions 820 and/or data 822 may be received, sent or stored upon different types of computer-accessible media or on similar media separate from system memory 804 or computer system 800. In various embodiments, some or all of the functionality described herein may be implemented via such a computer system 800.

In one embodiment, I/O interface 806 may be configured to coordinate I/O traffic between processor 802, system memory 804, and any peripheral devices in the device, including network interface 810 or other peripheral interfaces, such as input/output devices 812. In some embodiments, I/O interface 806 may perform any necessary protocol, timing or other data transformations to convert data signals from one component (e.g., system memory 804) into a format suitable for use by another component (e.g., processor 802). In some embodiments, I/O interface 806 may include support for devices attached through various types of peripheral buses, such as a variant of the Peripheral Component Interconnect (PCI) bus standard or the Universal Serial Bus (USB) standard, for example. In some embodiments, the function of I/O interface 806 may be split into two or more separate components, such as a north bridge and a south bridge, for example. Also, in some embodiments some or all of the functionality of I/O interface 806, such as an interface to system memory 804, may be incorporated directly into processor 802.

Network interface 810 may be configured to allow data to be exchanged between computer system 800 and other devices attached to a network 824 (e.g., carrier or agent devices) or between nodes of computer system 800. Network 824 may in various embodiments include one or more networks including but not limited to Local Area Networks (LANs) (e.g., an Ethernet or corporate network), Wide Area Networks (WANs) (e.g., the Internet), wireless data networks, some other electronic data network, or some combination thereof. In various embodiments, network interface 810 may support communication via wired or wireless general data networks, such as any suitable type of Ethernet network, for example; via telecommunications/telephony networks such as analog voice networks or digital fiber communications networks; via storage area networks such as Fibre Channel SANs, or via any other suitable type of network and/or protocol.

Input/output devices 812 may, in some embodiments, include one or more display terminals, keyboards, keypads, touchpads, scanning devices, voice or optical recognition devices, or any other devices suitable for entering or accessing data by one or more computer systems 800. Multiple input/output devices 812 may be present in computer system 800 or may be distributed on various nodes of computer system 800. In some embodiments, similar input/output devices may be separate from computer system 800 and may interact with one or more nodes of computer system 800 through a wired or wireless connection, such as over network interface 810.

Those skilled in the art will appreciate that computer system 800 is merely illustrative and is not intended to limit the scope of embodiments. In particular, the computer system and devices may include any combination of hardware or software that can perform the indicated functions, including computers, network devices, Internet appliances, PDAs, wireless phones, pagers, etc. Computer system 800 may also be connected to other devices that are not illustrated, or instead may operate as a stand-alone system. In addition, the functionality provided by the illustrated components may in some embodiments be combined in fewer components or distributed in additional components. Similarly, in some embodiments, the functionality of some of the illustrated components may not be provided and/or other additional functionality may be available.

Those skilled in the art will also appreciate that, while various items are illustrated as being stored in memory or on storage while being used, these items or portions of them may be transferred between memory and other storage devices for purposes of memory management and data integrity. Alternatively, in other embodiments some or all of the software components may execute in memory on another device and communicate with the illustrated computer system via inter-computer communication. Some or all of the system components or data structures may also be stored (e.g., as instructions or structured data) on a computer-accessible medium or a portable article to be read by an appropriate drive, various examples of which are described above. In some embodiments, instructions stored on a computer-accessible medium separate from computer system 800 may be transmitted to computer system 800 via transmission media or signals such as electrical, electromagnetic, or digital signals, conveyed via a communication medium such as a network and/or a wireless link. Various embodiments may further include receiving, sending or storing instructions and/or data implemented in accordance with the foregoing description upon a computer-accessible medium. Generally speaking, a computer-accessible medium may include a non-transitory, computer-readable storage medium or memory medium such as magnetic or optical media, e.g., disk or DVD/CD-ROM, volatile or non-volatile media such as RAM (e.g. SDRAM, DDR, RDRAM, SRAM, etc.), ROM, etc. In some embodiments, a computer-accessible medium may include transmission media or signals such as electrical, electromagnetic, or digital signals, conveyed via a communication medium such as network and/or a wireless link.

The methods described herein may be implemented in software, hardware, or a combination thereof, in different embodiments. In addition, the order of the blocks of the methods may be changed, and various elements may be added, reordered, combined, omitted, modified, etc. Various modifications and changes may be made as would be obvious to a person skilled in the art having the benefit of this disclosure. The various embodiments described herein are meant to be illustrative and not limiting. Many variations, modifications, additions, and improvements are possible. Accordingly, plural instances may be provided for components described herein as a single instance. Boundaries between various components, operations and data stores are somewhat arbitrary, and particular operations are illustrated in the context of specific illustrative configurations. Other allocations of functionality are envisioned and may fall within the scope of claims that follow. Finally, structures and functionality presented as discrete components in the example configurations may be implemented as a combined structure or component. These and other variations, modifications, additions, and improvements may fall within the scope of embodiments as defined in the claims that follow.

What is claimed is:

1. A system, comprising:

one or more lenses;

an organic substrate formed as one single piece of an organic circuit board or multiple separate organic circuit boards joined together;

an image sensor attached to the organic substrate and in contact with an image side surface of the organic substrate to communicate electrical signals over conductive traces routed at multiple layers of the organic circuit board or the multiple separate organic circuit boards; and an infrared (IR) light filter attached to the organic substrate at a second side opposite the image side surface, such that the IR light filter is positioned optically between the one or more lenses and the image sensor, wherein the organic substrate includes an opening between the IR light filter and the image sensor to allow light passing through the IR light filter to reach the image sensor through the opening.

2. The system of claim 1, wherein the organic substrate includes one or more electrical traces embedded inside the organic substrate.

3. The system of claim 2, wherein at least some of the electrical traces are formed using copper.

4. The system of claim 1, wherein the organic substrate further includes a first recess at the second side of the organic substrate at least partially overlapping the opening, and wherein the IR light filter is placed at least partially within the first recess.

5. The system of claim 1, wherein the IR light filter is placed on a surface, not at least partially within a recess, at the second side of the organic substrate.

6. The system of claim 1, wherein the organic substrate further includes a second recess at the image side surface proximate an edge of the organic substrate.

7. The system of claim 1, wherein the organic substrate is formed using one or more organic materials including polyimide, ajinomoto build-up film (ABF), polytetrafluoroethylene (PTFE), polyetheretherketone (PEEK), or flame retardant woven glass reinforced epoxy resin (FR-4).

8. The system of claim 4, wherein the first recess is formed by creating one or more trenches within the organic substrate using a laser process to indicate a portion of the organic substrate and removing the indicated portion using an etching process.

9. The system of claim 1, further comprising:

an actuator configured to move the image sensor and the organic substrate relative to the one or more lenses, wherein the actuator includes one or more coils and one or more magnets, and wherein the one or more coils of the actuator are attached to the organic substrate.

10. The system of claim 9, further comprising:

a suspension structure configured to enable the movability of the image sensor and the organic substrate, wherein the suspension structure includes an inner frame and an outer frame that is connected with the inner frame through one or more flexure arms.

11. A device, comprising:

a camera that comprises:

one or more lenses;

an organic substrate formed as one single piece of an organic circuit board or multiple separate organic circuit boards joined together;

an image sensor attached to the organic substrate and in contact with an image side surface of the organic substrate to communicate electrical signals over conductive traces routed at multiple layers of the organic circuit board or the multiple separate organic circuit boards and to generate image signals based on light passing through the one or more lenses along an optical axis; and an infrared (IR) light filter attached to the organic substrate at a second side opposite the image side surface, such that the IR light filter is positioned optically between the one or more lenses and the image sensor; and a processor configured to process the image signals generated from the image sensor of the camera to produce one or more images, wherein the organic substrate of the camera includes an opening between the IR light filter and the image sensor to allow the light passing through the IR light filter to reach the image sensor through the opening.

12. The device of claim 11, wherein the organic substrate includes one or more electrical traces embedded inside the organic substrate, and wherein at least some of the electrical traces are formed using copper.

13. The device of claim 11, wherein the organic substrate further includes a first recess at the second side of the organic substrate at least partially overlapping the opening, and wherein the IR light filter is placed at least partially within the first recess.

14. The device of claim 11, wherein the IR light filter is placed on a surface, not at least partially within a recess, at the second side of the organic substrate.

15. The device of claim 11, wherein the organic substrate further includes a second recess at the image side surface proximate an edge of the organic substrate.

16. The device of claim 11, wherein the organic substrate is formed using one or more organic materials including polyimide, ajinomoto build-up film (ABF), polytetrafluoroethylene (PTFE), polyetheretherketone (PEEK), or flame retardant woven glass reinforced epoxy resin (FR-4).

17. The device of claim 11, further comprising:

an actuator configured to move the image sensor and the organic substrate relative to the one or more lenses in one or more directions orthogonal to the optical axis.

18. The device of claim 11, further comprising:

an actuator configured to move the one or more lenses relative to the image sensor and the organic substrate in a direction parallel to the optical axis.

19. A system, comprising:

one or more lenses;

an organic printed circuit board (PCB) movable relative to the one or more lenses and formed as a single piece organic circuit board or multiple separate organic circuit boards joined together;

an image sensor attached to the organic PCB and in contact with an image side surface of the organic PCB to communicate electrical signals over conductive traces routed at multiple layers of the organic circuit board or the multiple separate organic circuit boards and to generate image signals based on light passing through the one or more lenses; and an actuator configured to move the image sensor and the organic PCB relative to the one or more lenses.

20. The system of claim 19, further comprising:

an infrared (IR) light filter attached to the organic PCB at a second side opposite the image side surface, such that the IR light filter is positioned optically between the one or more lenses and the image sensor, wherein the organic PCB includes an opening through a body of the organic PCB, positioned between the IR light filter and the image sensor, to allow the light passing through the IR light filter to reach the image sensor through the opening.

* * * * *